(12) United States Patent
Huang et al.

(10) Patent No.: US 7,926,980 B2
(45) Date of Patent: Apr. 19, 2011

(54) ELECTRONIC DEVICE

(75) Inventors: Bin Huang, Shenzhen (CN); Shih-Chi Wong, Taipei Hsien (TW); Chih-Yu Yeh, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 220 days.

(21) Appl. No.: 12/247,991

(22) Filed: Oct. 8, 2008

(65) Prior Publication Data

US 2009/0268465 A1 Oct. 29, 2009

(30) Foreign Application Priority Data

Apr. 28, 2008 (CN) .......................... 2008 1 0301326

(51) Int. Cl.
*F21S 6/00* (2006.01)
*F21V 15/00* (2006.01)

(52) U.S. Cl. ..................... 362/257; 362/362; 362/311.01

(58) Field of Classification Search .................. 362/257, 362/311.01, 311.02, 238, 240, 249.02, 234, 362/253, 311.14, 362, 85
See application file for complete search history.

(56) References Cited

U.S. PATENT DOCUMENTS

| 4,254,453 | A  | * | 3/1981 | Mouyard et al. | .............. | 362/240 |
| 6,229,713 | B1 |   | 5/2001 | Schmitt et al. | | |
| 6,286,972 | B1 | * | 9/2001 | Shepherd et al. | .............. | 362/86 |
| 7,255,466 | B2 | * | 8/2007 | Schmidt et al. | .............. | 362/501 |
| 2004/0012967 | A1 | | 1/2004 | Keller et al. | | |
| 2007/0019395 | A1 | | 1/2007 | Yeh et al. | | |
| 2008/0218994 | A1 | * | 9/2008 | Chen et al. | ...................... | 362/85 |

* cited by examiner

*Primary Examiner* — Bao Q Truong
(74) *Attorney, Agent, or Firm* — Frank R. Niranjan

(57) ABSTRACT

An electronic device includes a housing and at least one light source. The housing defines a chamber therein and includes an inner surface defining at least one recess configured with a specified pattern. The at least one light source is fixed in the chamber and corresponds to the at least one recess. The at least one recess is transparent and the at least one light source transmits light to the at least one recess, thereby displaying the specified pattern on an outer surface opposite to the inner surface of the housing.

11 Claims, 4 Drawing Sheets

ELECTRONIC DEVICE

BACKGROUND

1. Field of the Invention

The disclosure relates to electronic devices and, specifically, to an electronic device with a pattern-displaying design.

2. Description of Related Art

The design for displaying patterns of an electronic device usually includes light-guiding pillars to transmit beams of light. Generally, the patterns are printed on a film, such as a polycarbonate (PC) film. The PC film having patterns is adhered to an inner surface of a housing of the electronic device, and a light-guiding pillar is set under each pattern by thermal melting. A light source, such as an LED located under each light-guiding pillar, transmits light therefrom to the inner surface of the housing, thereby displaying the patterns on an outer surface of the housing. The housing is usually transparent, so a Mylar film is required to adhere to the inner surface of the housing and around the PC film to prevent the housing from being transparent.

However, when components such as light-guiding pillars and Mylar film are used, molds must be manufactured and subsequently used to fabricate the components according to the product requirements, complicating assembly of the electronic device and greatly increasing production costs.

Therefore, it is desirable to provide an electronic device requiring no light-guiding pillar or Mylar film, reducing production costs and simplifying assembly.

SUMMARY

According to an exemplary embodiment of the disclosure, an electronic device includes a housing and at least one light source. The housing defines a chamber therein and includes an inner surface defining at least one recess configured with a specified pattern. The at least one light source is fixed in the chamber and corresponds to the at least one recess. The at least one recess is transparent and the at least one light source transmits light thereto, thereby displaying the specified pattern on an outer surface opposite to the inner surface of the housing.

Other advantages and novel features will become more apparent from the following detailed description when taken in conjunction with the accompanying drawings, in which:

DETAILED DESCRIPTION OF THE EMBODIMENTS

Figure 1:
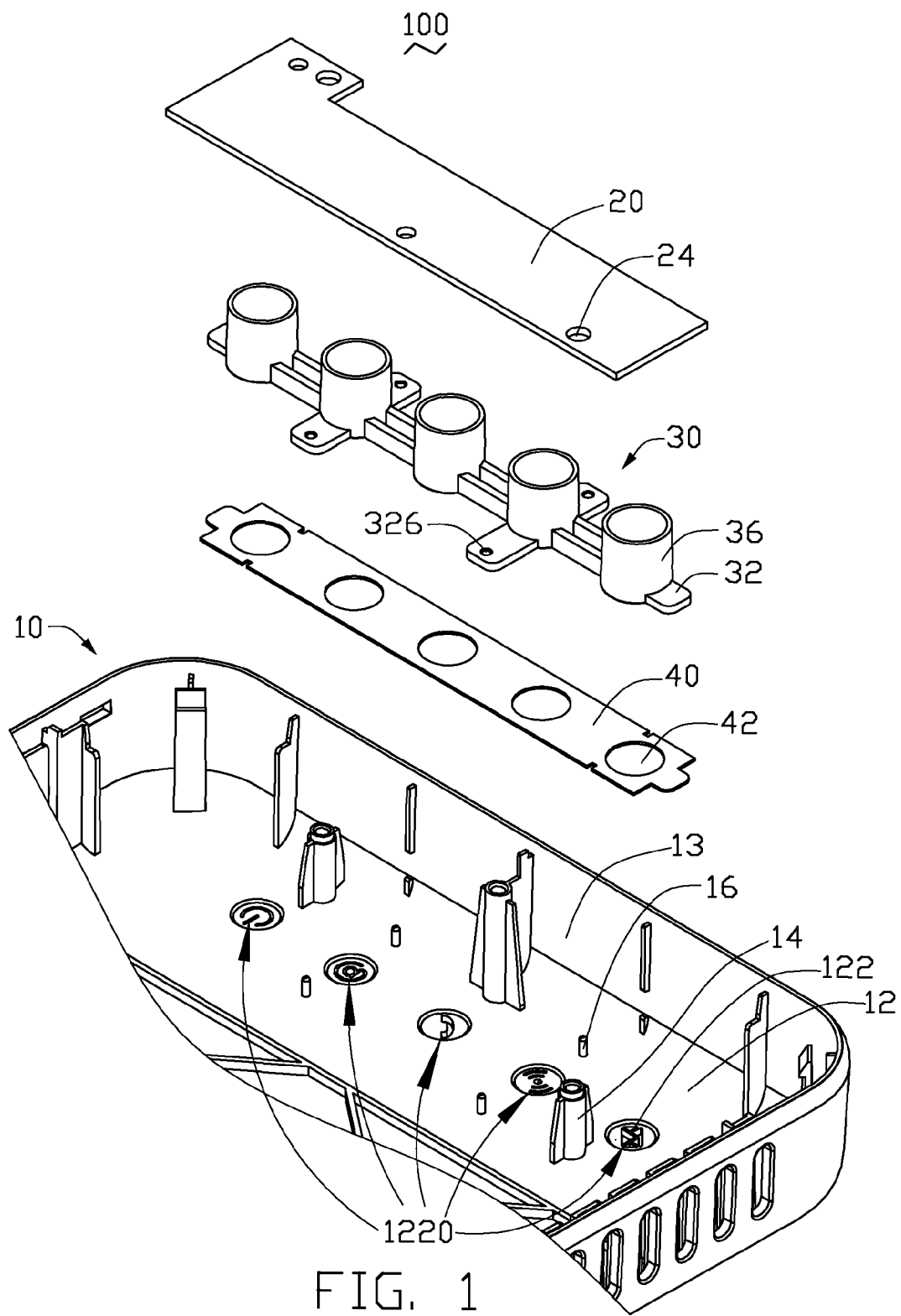
FIG. 1 is one exploded perspective view of an electronic device in accordance with an exemplary embodiment.

Referring to FIG. 1, an electronic device 100 comprises a housing 10. The housing 10 defines at least one recess 122 in an inner surface 12 thereof, the at least one recess 122 is transparent and configured with a specified pattern 1220 indicating the usage conditions of the electronic device 100, such as on/off state, network connection state, as illustrated in FIG. 1. The housing 10 defines a chamber 13 therein, and comprises a plurality of position posts 14 and a plurality of position pins 16 extending from the inner surface 12 towards the chamber 13, which are located around the recess 122.

In this embodiment, the housing 10 is plastic as typically used in electronic devices, such as acrylonitrile-butadiene-styrene (ABS), polyvinyl chloride (PC), or high impact polystyrene (HIPS). The at least one recess 122 is formed in the housing 10 by a single injection molding, and the housing 10 need not be transparent or semi-transparent. Light transmitting performance of the material increases with thinness thereof, whereby recess 122 is thinner than other portions of the housing 10, with resultingly improved transparency thereof. In a best mode, the housing 10 is white ABS with thickness of the recess 122 0.65 mm.

Figure 2:
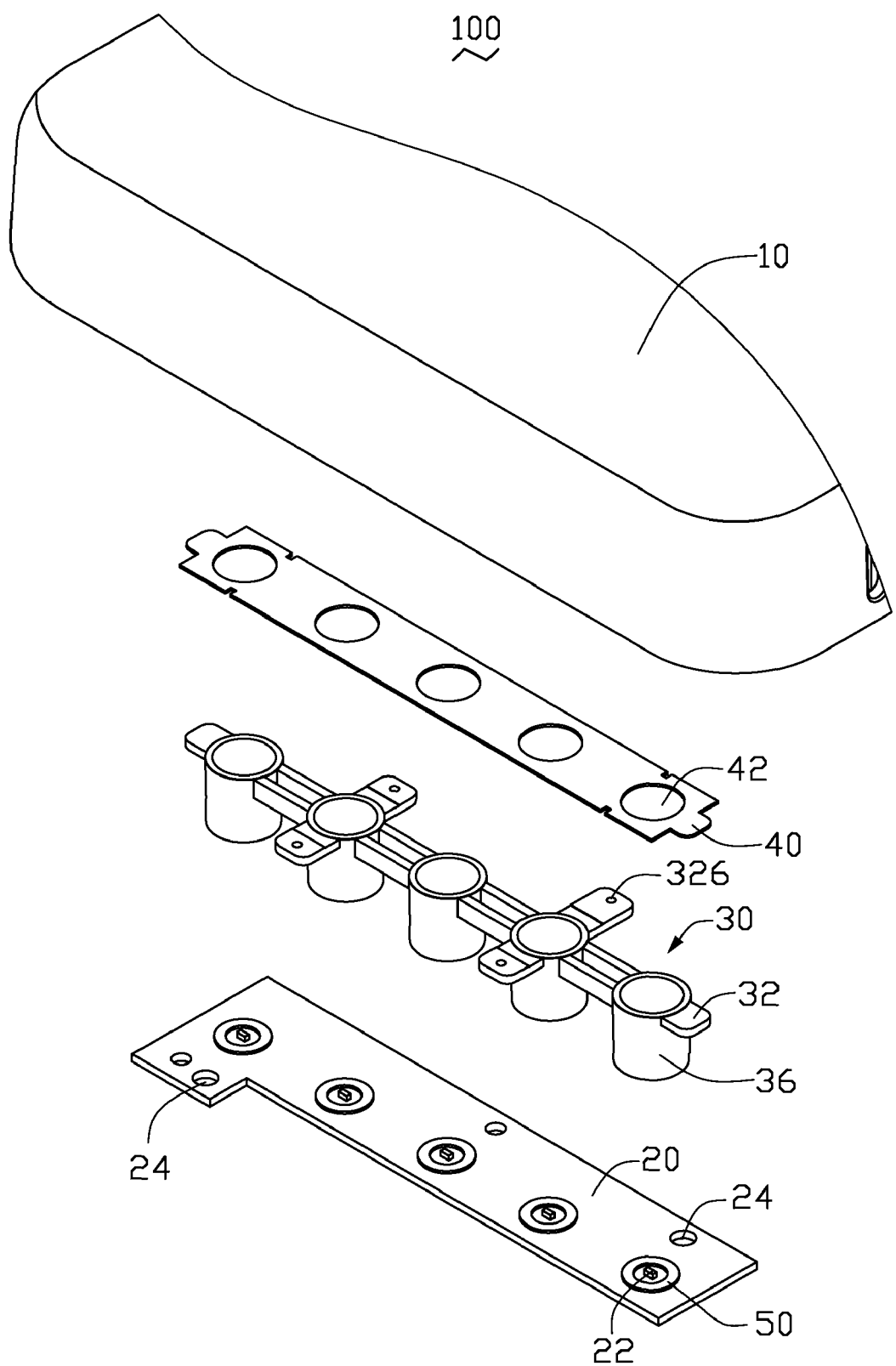
FIG. 2 is another exploded perspective view of the electronic device of FIG. 1.
Figure 3:
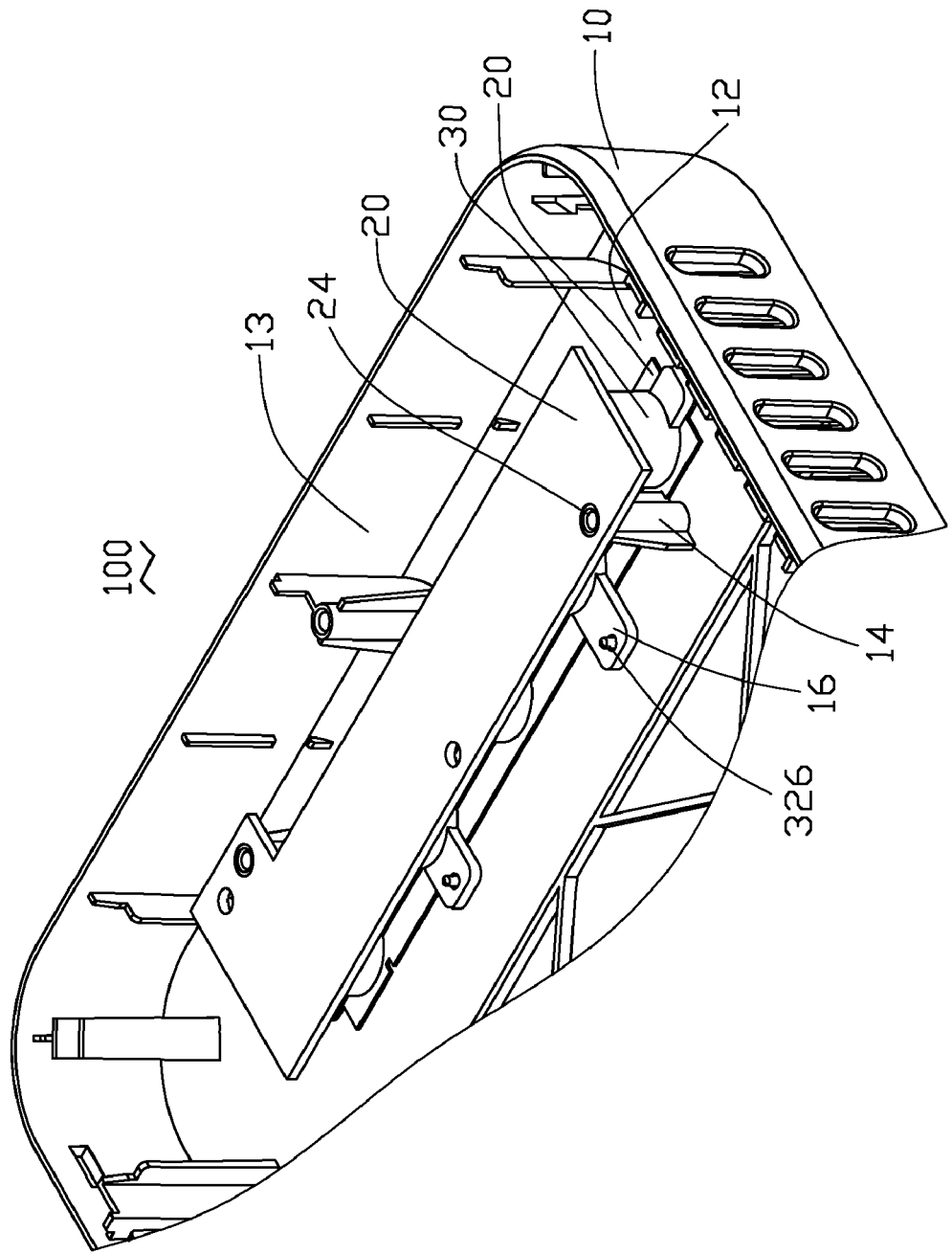
FIG. 3 is a perspective view of the electronic device of FIG. 1.

Referring to FIG. 2 and FIG. 3, at least one light source 22 fixed in the chamber 13 corresponds to the at least one recess 122. In this embodiment, the at least one light source 22 is located on a printed circuit board (PCB) 20, and the PCB 20 defines a plurality of position holes 24 matching the plurality of position posts 14 for fixing the PCB 20 in the housing 10. In other embodiments, the at least one light source 22 can be fixed in any other location, such as the inner surface 12 of the housing 10 or a fixing element located in the chamber 12, other than PCB 20.

The at least one light source 22 transmits light to the at least one recess 122 configured as the specified pattern 1220, thereby displaying the specified pattern 1220 on an outer surface opposite to the inner surface 12 of the housing 10. For improved clarity, the electronic device 100 also comprises a shading device 30 between the inner surface 12 and the at least one light source 22 for securing the light source 22 independently. In this embodiment, the electronic device 100 comprises a plurality of light sources 22, and the shading device 20 spaces the light sources 22 from each other. The shading device 30 comprises a first end 32 adjacent to the inner wall 12 and at least one shading sleeve 36. The first end 32 defines a plurality of position holes 326 matching the position pins 16 for fixing the shading device 30 in the housing 10. The at least one shading sleeve 36 comprises two ends respectively encompassing the at least one recess 122 and the at least one light source 22, allowing the light from the light source 22 to be fully transmitted to the recess 122.

In other embodiments, the shading device 30 can comprise a plurality of boards rather than the shading sleeve 36, wherein first ends of the boards are fixed on the PCB 20 between two adjacent light sources 22 and other ends of the boards are fixed on the inner surface 12 between two adjacent recesses 122. The light from the light source 22 is fully transmitted to the recess 122 via the channel between the boards.

In other embodiments, the at least one light source 22 can also be fixed on one end away from the first end 32 of the shading device 30

Figure 4:
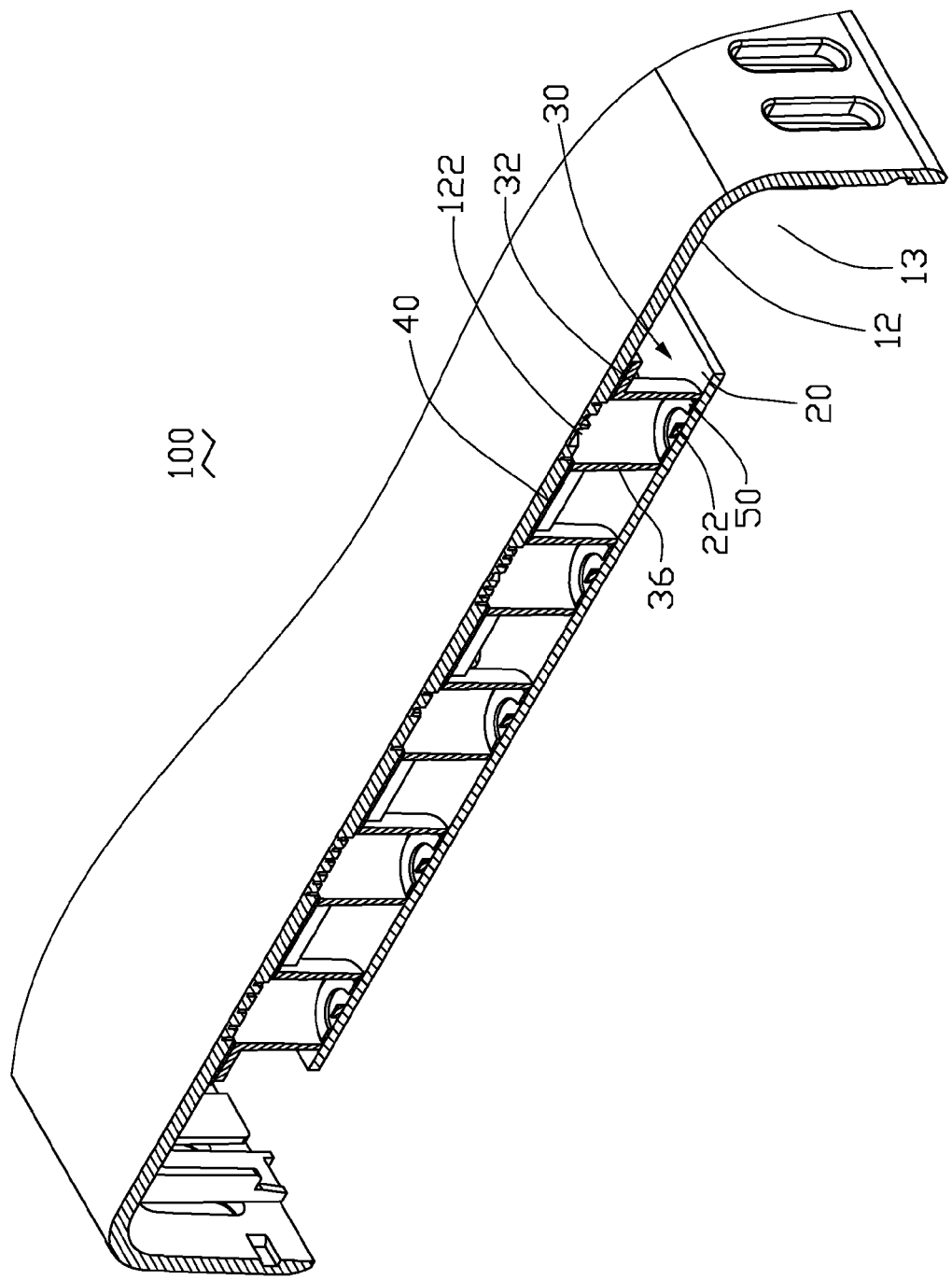
FIG. 4 is a sectional view of the electronic device of FIG. 1

Referring to FIG. 2 and FIG. 4, the electronic device 100 further comprises a first sealing element 40 located between the inner surface 12 and the shading device 30, and a second sealing element 50 located between the shading device 30 and the light source 22, preventing light from the light source 22 from transmitting therebetween. The first sealing element 40 is adhered around the at least one recess 122 on the inner surface 12, and two surfaces of the first element 40 respectively contact the inner surface 12 and the first end 32 of the shading device. The first sealing element 40 defines at least one hole 42, in which the at least one recess 122 is received. The second sealing element 50 comprises at least one sealing ring respectively located around the at least one light source. In this embodiment, the at least one sealing ring is received in the at least one shading sleeve 36. The first and the second sealing element 40, 50 are condensable material, such as foam.

The first and the second sealing elements 40, 50 can prevent light from the light source 22 from being transmitted thorough gaps between the shading device 30 and the inner surface 12 or the PCB 20, thereby allowing the specified pattern 1220 to be displayed on the outer surface of the housing 10 more clearly.

The housing 10 can be any common plastic material, reducing production costs. In the application, when the at least one light source 22 is turned off, no pattern is shown on the outer surface of the housing 10 due to the at least one recess being formed in the inner surface 12, and as a result, the structure of the outer surface being flat.

While exemplary embodiments have been described, it should be understood that they have been presented by way of example only and of limitation. Thus, the breadth and scope of the disclosure should not be limited by the described exemplary embodiments, but only in accordance with the following claims and their equivalents.

What is claimed is:

1. An electronic device, comprising:
   a housing surrounding a chamber and comprising an inner surface defining at least one recess configured with a specified pattern;
   at least one light source fixed in the chamber and corresponding to the at least one recess; and
   a printed circuit board (PCB) located in the chamber and fixed to the housing, on which the at least one light source is located;
   wherein the housing comprises a plurality of position posts extending from the inner surface towards the chamber, and the PCB defines a plurality of position holes matching the position posts for fixing the PCB in the housing;
   wherein the at least one recess is transparent and the at least one light source transmits light to the at least one recess, thereby displaying the specified pattern of the at least one recess on an outer surface opposite to the inner surface of the housing.

2. The electronic device as claimed in claim 1, wherein the housing is plastic, and the at least one recess is formed by a single injection molding.

3. The electronic device as claimed in claim 2, wherein the housing is not transparent.

4. The electronic device as claimed in claim 1, further comprising a shading device located between the inner surface and the at least one light source for securing the light source independently.

5. The electronic device as claimed in claim 4, wherein the shading device comprises at least one shading sleeve with two ends respectively encompassing the at least one recess and the at least one light source.

6. The electronic device as claimed in claim 4, wherein the housing comprises a plurality of position pins extending from the inner surface thereof, and the shading device defines a plurality of position holes matching the position pins for fixing the shading device in the housing.

7. The electronic device as claimed in claim 4, further comprising a first sealing element located between the inner surface and the shading device for preventing light from transmitting therethrough.

8. The electronic device as claimed in claim 4, further comprising a second sealing element located between the shading device and the at least one light source preventing the light from transmitting therethrough.

9. The electronic device as claimed in claim 8, wherein the second sealing element comprises at least one sealing ring respectively located around the at least one light source.

10. The electronic device as claimed in claim 9, wherein the at least one sealing ring is received in the at least one shading sleeve.

11. The electronic device as claimed in claim 8, wherein the second sealing element is condensable material.

* * * * *